United States Patent
Janitch

(10) Patent No.: US 9,069,056 B2
(45) Date of Patent: Jun. 30, 2015

(54) GUIDED WAVE RADAR PROBE REFERENCE TARGET

(71) Applicant: Magnetrol International, Incorporated, Downers Grove, IL (US)

(72) Inventor: Paul G. Janitch, Lisle, IL (US)

(73) Assignee: Magnetrol International, Incorporated, Aurora, IL (US)

( * ) Notice: Subject to any disclaimer, the term of this patent is extended or adjusted under 35 U.S.C. 154(b) by 298 days.

(21) Appl. No.: 13/653,863

(22) Filed: Oct. 17, 2012

(65) Prior Publication Data
US 2014/0104099 A1   Apr. 17, 2014

(51) Int. Cl.
*G01S 7/03* (2006.01)
*H01P 1/30* (2006.01)
*G01F 23/284* (2006.01)

(52) U.S. Cl.
CPC .............. *G01S 7/032* (2013.01); *G01F 23/284* (2013.01)

(58) Field of Classification Search
CPC ........... G01V 3/12; G01S 7/032; G01S 13/08; G01S 13/88; G01F 23/284; G01F 23/22; G01R 1/067; G01R 1/06772; H01P 1/30
USPC ............. 342/124, 175; 73/290 R, 298, 304 R
See application file for complete search history.

(56) References Cited

U.S. PATENT DOCUMENTS

| | | | | |
|---|---|---|---|---|
| 4,475,389 A | * | 10/1984 | Harris | 73/304 R |
| 4,983,909 A | * | 1/1991 | Swart et al. | 324/755.05 |
| 5,233,290 A | * | 8/1993 | Swart | 324/72.5 |
| 6,734,689 B1 | * | 5/2004 | Yang | 324/755.02 |
| 2009/0229359 A1 | * | 9/2009 | Reimelt et al. | 73/304 R |
| 2013/0314275 A1 | * | 11/2013 | Fredriksson et al. | 342/124 |
| 2014/0103950 A1 | * | 4/2014 | Janitch | 324/754.06 |
| 2014/0104099 A1 | * | 4/2014 | Janitch | 342/124 |

* cited by examiner

*Primary Examiner* — John B Sotomayor
(74) *Attorney, Agent, or Firm* — Wood, Phillips, Katz, Clark & Mortimer

(57) ABSTRACT

A probe defining a transmission line is used with a measurement instrument including a pulse circuit connected to the probe for generating pulses on the transmission line and receiving reflected pulses on the transmission line. The probe comprises an adapter for mounting to a process vessel. A conductive outer sleeve is secured to the adapter. A center conductor is coaxial with the outer sleeve for conducting the pulses. The conductive outer sleeve has a connector end proximate the adapter and a distal end to extend into a processed liquid. The outer sleeve has a geometric discontinuity defining a referenced target producing an impedance change at a position between the adapter and the distal end at a location in a process vapor region above a processed liquid.

20 Claims, 6 Drawing Sheets

Fig. 6

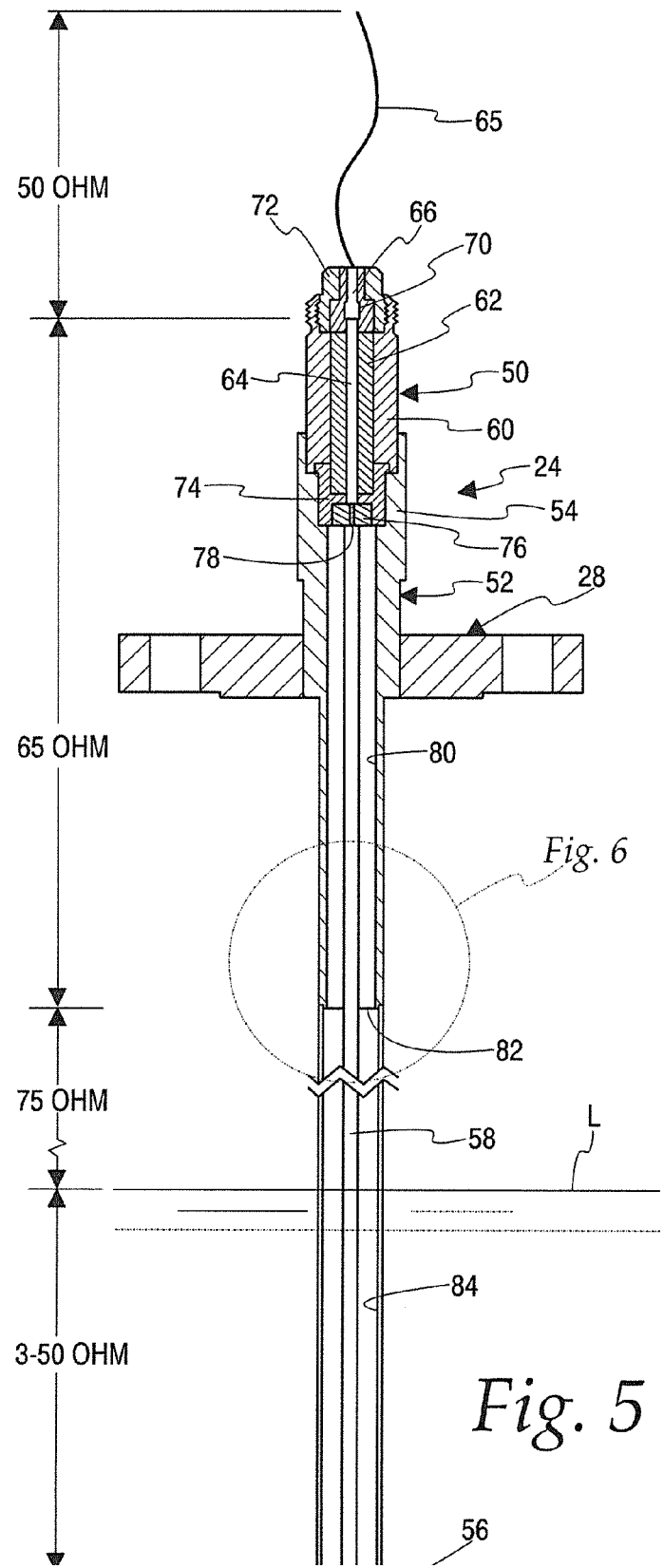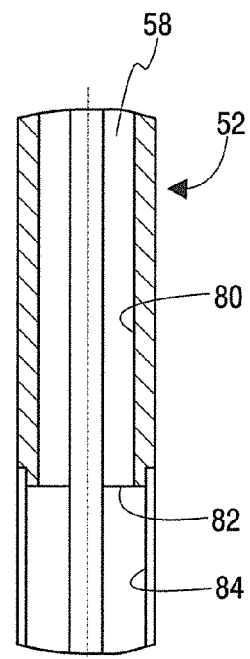
Fig. 6
Fig. 5

GUIDED WAVE RADAR PROBE REFERENCE TARGET

CROSS-REFERENCE TO RELATED APPLICATIONS

Not Applicable.

FEDERALLY SPONSORED RESEARCH OR DEVELOPMENT

Not Applicable.

MICROFICHE/COPYRIGHT REFERENCE

Not Applicable.

FIELD OF THE INVENTION

This invention relates to process control instruments, and more particularly, to a guided wave radar probe reference target.

BACKGROUND

Process control systems require the accurate measurement of process variables. Typically, a primary element senses the value of a process variable and a transmitter develops an output having a value that varies as a function of the process variable. For example, a level transmitter includes a primary element for sensing level and a circuit for developing an electrical signal proportional to sensed level.

Knowledge of level in industrial process tanks or vessels has long been required for safe and cost-effective operation of plants. Many technologies exist for making level measurements. These include buoyancy, capacitance, ultrasonic and microwave radar, to name a few. Recent advances in micropower impulse radar (MIR), also known as ultra-wideband (UWB) radar, in conjunction with advances in equivalent time sampling (ETS), permit development of low power and low cost time domain reflectometry (TDR) instruments.

In a TDR instrument, a very fast pulse with a rise time of 500 picoseconds, or less, is propagated down a probe, that serves as a transmission line, in a vessel. The pulse is reflected by a discontinuity caused by a transition between two media. For level measurement, that transition is typically where the air and the material to be measured meet. These instruments are also known as guided wave radar (GWR) measurement instruments.

In one form, a guided wave radar (GWR) transmitter uses a coaxial probe that functions as an electrical transmission line into the process vessel. The GWR measurement process begins with an electrical pulse that is launched along the probe from one end. A typical coaxial probe 10 is illustrated in FIG. 3. A TDR circuit identifies impedance discontinuities along the length of the probe, as shown in the impedance chart of FIG. 3. One source of an impedance discontinuity occurs at the vapor to liquid interface due to the difference in the relative dielectrics of the media. The TDR circuit detects, and locates in time, the reflected signal from the interface. Another source of an impedance discontinuity can be a change in geometry in the transmission line. This is a convenient method for producing a known reference location, called a fiducial (FID) in the probe. The difference in the TDR time measurements of the fiducial to the vapor to liquid interface is used to calculate the liquid level. Another impedance discontinuity exists at the end of the probe (EOP). With this type of probe and TDR circuit an increased impedance creates a positive reflected signal and a decrease in impedance creates a negative reflected signal, as shown in the echo curve of FIG. 3. As is apparent, the probe, impedance chart and echo curve in FIG. 3 are aligned to illustrate physically along the probe where the impedance changes occur and the resultant echo curve caused by these impedance changes.

The velocity of the signal propagation is a function of the relative dielectric of the medium. A problem occurs when the relative dielectric of the vapor varies due to changes in temperature, pressure or vapor composition. A known solution to this problem is to create an impedance discontinuity at a known location in the process vapor region, called a reference target. The reference target is used to measure the actual propagation velocity in the vapor. The measured propagation velocity is used for a more accurate level measurement. This technique is illustrated in FIG. 4 which shows a probe 12 including a target sleeve 14 on the probe center conductor 16. There are impedance changes which occur at each end of the target sleeve 14, as illustrated. This produces a negative reflection at the leading edge and a positive reflection at the trailing edge of the reference target. This results in transmission losses, which results in a smaller level signal. Also, the negative reflection can be confused as a level signal.

The present invention is directed to solving one or more of the problems discussed above in a novel and simple manner.

SUMMARY

As described herein, a guided wave radar probe employs an outer reference target to compensate for changes in signal transmission propagation speed due to varying media dielectric.

There is disclosed in accordance with one aspect of the invention a probe defining a transmission line for use with a measurement instrument including a pulse circuit connected to the probe for generating pulses on the transmission line and receiving reflected pulses on the transmission line. The probe comprises an adapter for mounting to a process vessel. A conductive outer sleeve is secured to the adapter. A center conductor is coaxial with the outer sleeve for conducting the pulses. The conductive outer sleeve has a connector end proximate the adapter and a distal end to extend into a processed liquid. The outer sleeve has a geometric discontinuity defining a referenced target producing an impedance change at a position between the adapter and the distal end at a location in a process vapor region above a processed liquid.

There is disclosed in accordance with another aspect a probe comprising a connector for electrical connection to a pulse circuit. A conductive outer sleeve is secured at a connector end to the connector and has a distal end to extend into a process liquid. A center conductor is coaxial with the outer sleeve for conducting the pulses. The outer sleeve has a geometric discontinuity defining a reference target producing an impedance change at a position between the connector and the distal end at a location in a process vapor region above a process liquid.

There is disclosed in accordance with a further aspect a probe comprising a connector for electrical connection to the pulse circuit. A conductive outer sleeve is secured at a connector end to the connector and has a distal end to extend into the process liquid. A center conductor is coaxial with the outer sleeve for conducting the pulses. The probe has a reference target producing an impedance change at a position between the connector end and the distal end at a location in a process vapor region above a process liquid, wherein any reflected pulse at the reference target location has an opposite polarity to a process liquid reflected pulse at the process liquid level.

It is a feature that the outer sleeve has a uniform inner diameter from the adapter to the reference target. The outer sleeve inner diameter increases at the reference target. The outer sleeve has a uniform inner diameter from the reference target to the distal end.

It is another feature that the outer sleeve has a stepped up inner diameter at the reference target.

It is a further feature that the probe produces a single reflected pulse at the reference target location.

It is yet another feature that the probe produces a reference reflected pulse at the reference target location of an opposite polarity to a process liquid reflected pulse at the process liquid level.

It is another feature that any reflected pulse at the reference target location has a like polarity to an end of the probe reflected pulse produced at a distal end of the center conductor.

Other features and advantages will be apparent from a review of the entire specification, including the appended claims and drawings.

BRIEF DESCRIPTION OF THE DRAWINGS

FIG. 5 is a sectional view of a guided wave radar probe with reference target in accordance with the invention;

FIG. 6 is a detailed view taken from FIG. 5; and

DETAILED DESCRIPTION

Figure 1:
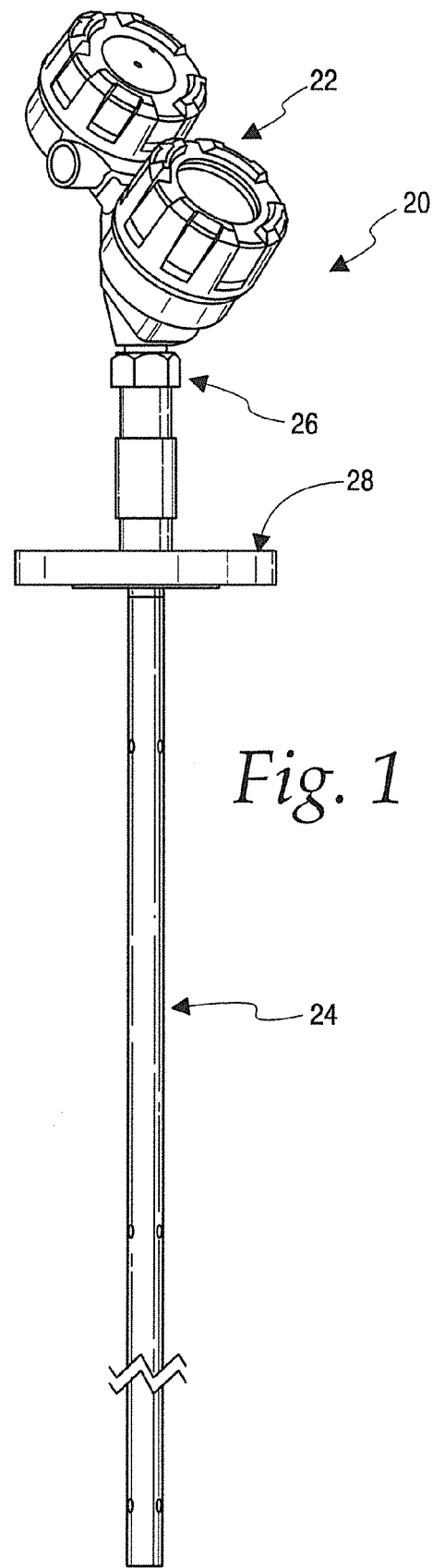
FIG. 1 is an elevation view of a guided wave radar instrument including a probe with a reference target.

Referring to FIG. 1, a process instrument 20 is illustrated. The process instrument 20 uses pulsed radar in conjunction with equivalent time sampling (ETS) and ultra-wide band (UWB) transceivers for measuring level using time domain reflectometry (TDR). Particularly, the instrument 20 uses guided wave radar for sensing level. While the embodiment described herein relates to a guided wave radar level sensing apparatus, various aspects of the invention may be used with other types of process instruments for measuring various process parameters.

The process instrument 20 includes a control housing 22, a probe 24, and a connector 26 for connecting the probe 24 to the housing 22. The probe 24 is mounted to a process vessel (not shown) using a flange 28. The housing 22 is then secured to the probe 24 as by threading the connector 26 to the probe 24 and also to the housing 22. The probe 24 comprises a high frequency transmission line which, when placed in a fluid, can be used to measure level of the fluid. Particularly, the probe 24 is controlled by a controller 30, described below, in the housing 22 for determining level in the vessel.

As described more particularly below, the controller 30 generates and transmits pulses on the probe 24. A reflected signal is developed off any impedance changes, such as the liquid surface of the material being measured. A small amount of energy may continue down the probe 24.

Guided wave radar combines TDR, ETS and low power circuitry. TDR uses pulses of electromagnetic (EM) energy to measure distanced or levels. When a pulse reaches a dielectric discontinuity then a part of the energy is reflected. The greater the dielectric difference, the greater the amplitude of the reflection. In the measurement instrument 20, the probe 24 comprises a wave guide with a characteristic impedance in air. When part of the probe 24 is immersed in a material other than air, there is lower impedance due to the increase in the dielectric. When the EM pulse is sent down the probe it meets the dielectric discontinuity, a reflection is generated.

ETS is used to measure the high speed, low power EM energy. The high speed EM energy (1000 foot/microsecond) is difficult to measure over short distances and at the resolution required in the process industry. ETS captures the EM signals in real time (nanoseconds) and reconstructs them in equivalent time (milliseconds), which is much easier to measure. ETS is accomplished by scanning the wave guide to collect thousands of samples. Approximately eight scans are taken per second.

Figure 2:
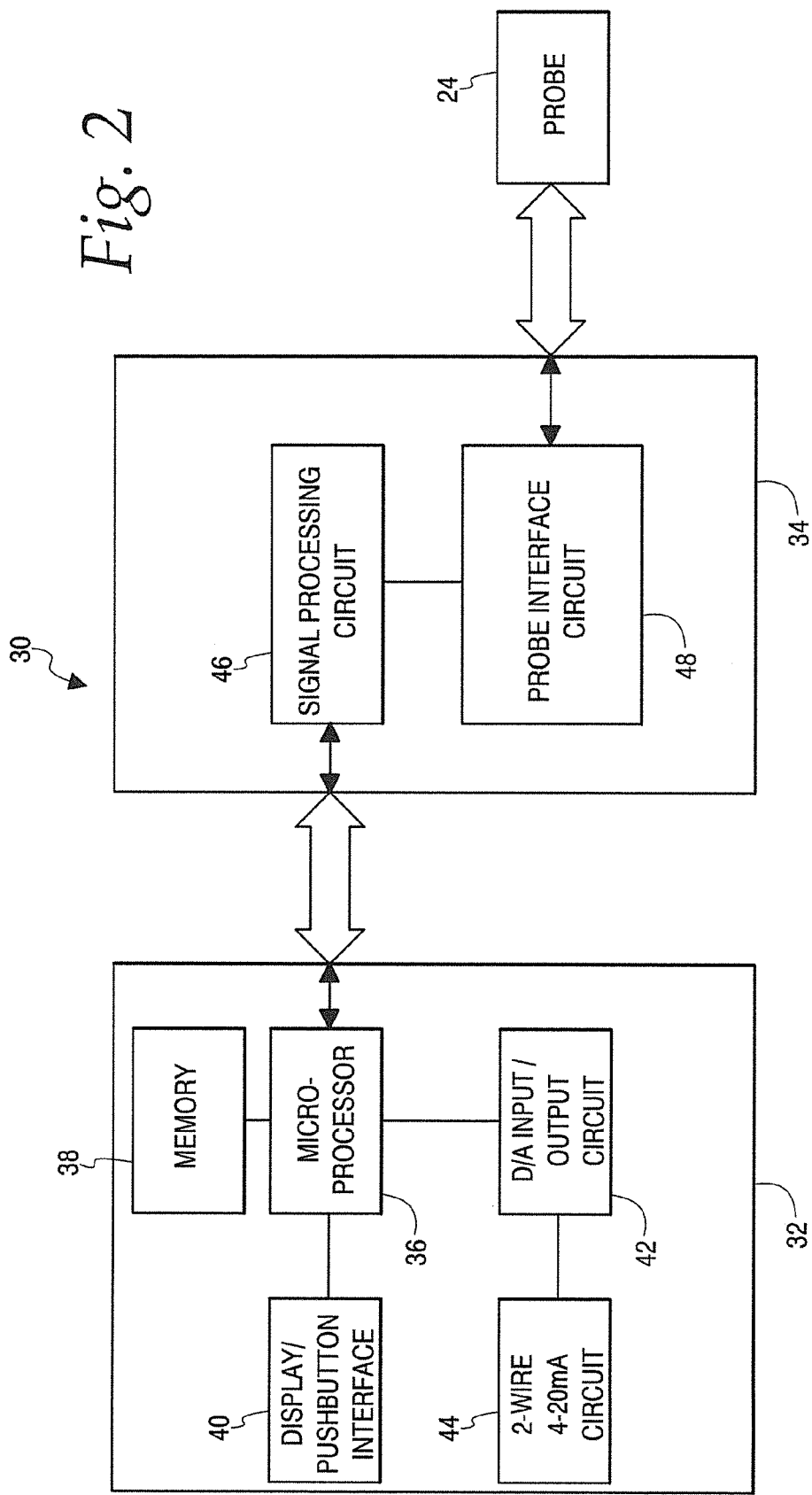
FIG. 2 is a block diagram of the transmitter of FIG. 1.
Figure 3:
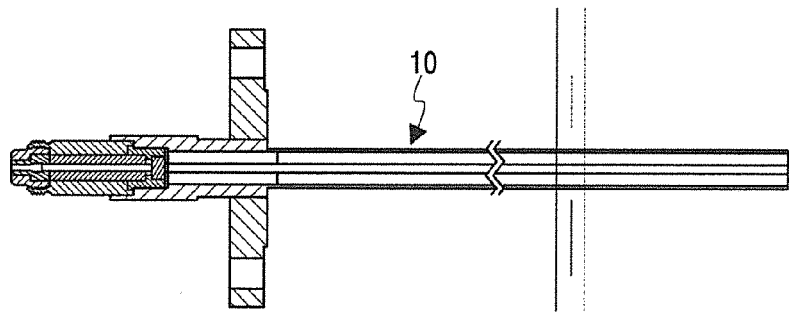
FIG. 3 is schematic representation of the operation of a prior art GWR probe without a reference target.
Figure 3:
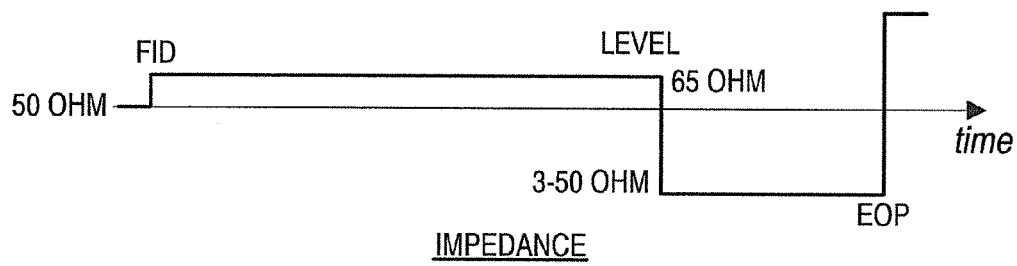
Figure 3:
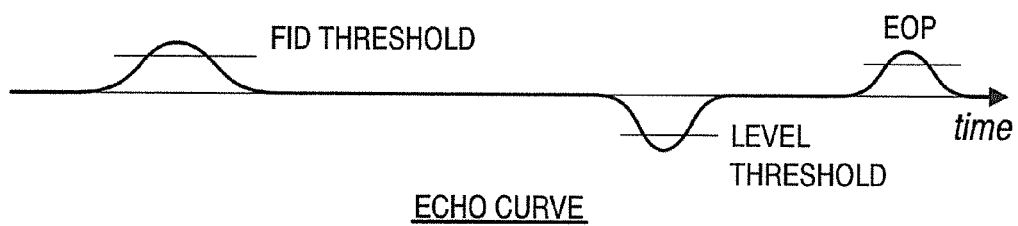
Figure 4:
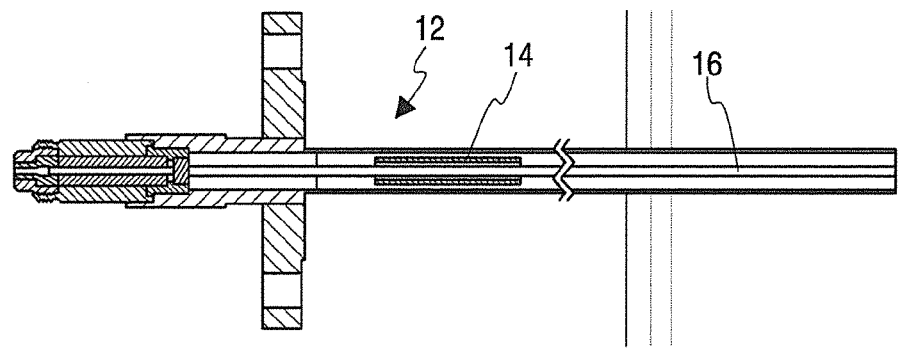
FIG. 4 is a schematic representation of the operation of a prior art GWR probe with a reference target.
Figure 4:
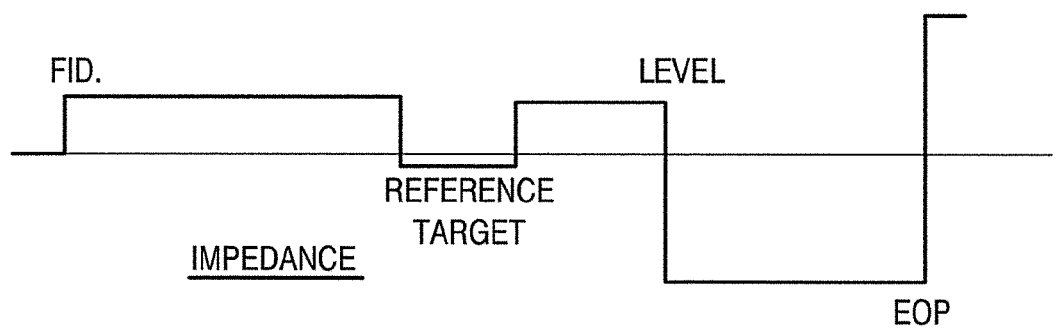
Figure 4:
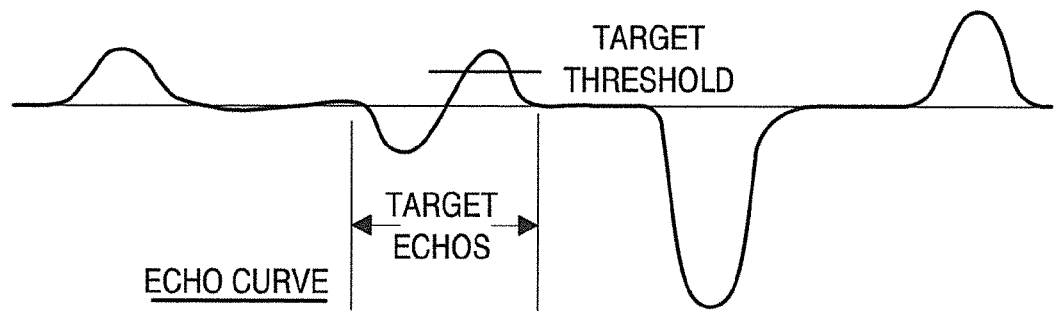

Referring to FIG. 2, the electronic circuitry mounted in the housing 22 of FIG. 1 is illustrated in block diagram form as an exemplary controller 30 connected to the probe 24. As will be apparent, the probe 24 could be used with other controller designs. The controller 30 includes a digital circuit 32 and an analog circuit 34. The digital circuit 32 includes a microprocessor 36 connected to a suitable memory 38 (the combination forming a computer) and a display/push button interface 40. The display/push button interface 40 is used for entering parameters with a keypad and displaying user and status information. The memory 38 comprises both non-volatile memory for storing programs and calibration parameters, as well as volatile memory used during level measurement. The microprocessor 36 is also connected to a digital to analog input/output circuit 42 which is in turn connected to a two-wire circuit 44 for connecting to a remote power source. Particularly, the two-wire circuit 44 utilizes loop control and power circuitry which is well known and commonly used in process instrumentation. The two-wire circuit 44 controls the current on the two-wire line in the range of 4-20 mA which represents level or other characteristics measured by the probe 24.

The microprocessor 36 is also connected to a signal processing circuit 46 of the analog circuit 34. The signal processing circuit 46 is in turn connected via a probe interface circuit 48 to the probe 24. The probe interface circuit 48 includes an ETS circuit which converts real time signals to equivalent time signals, as discussed above. The signal processing circuit 46 processes the ETS signals and provides a timed output to the microprocessor 36, as described more particularly below.

The general concept implemented by the ETS circuit is known. The probe interface circuit 48 generates hundreds of thousands of very fast pulses of 500 picoseconds or less rise time every second. The timing between pulses is tightly controlled. The reflected pulses are sampled at controlled intervals. The samples build a time multiplied "picture" of the reflected pulses. Since these pulses travel on the probe 24 at the speed of light, this picture represents approximately ten nanoseconds in real time for a five-foot probe. The probe interface circuit 48 converts the time to about seventy-one milliseconds. As is apparent, the exact time would depend on various factors, such as, for example, probe length. The largest signals have an amplitude on the order of twenty millivolts before amplification to the desired amplitude by common audio amplifiers. For a low power device, a threshold scheme is employed to give interrupts to the microprocessor 36 for select signals, namely, fiducial, target, level, and end of probe, as described below. The microprocessor 36 converts these timed interrupts into distance. With the probe length entered through the display/push button interface 40, or some other interface, the microprocessor 36 can calculate the level by subtracting from the probe length the difference between the fiducial and level distances. Changes in measured location of the reference target can be used for velocity compensation, as necessary or desired.

Referring to FIG. 5, the probe 24 comprises an electrical connector 50 for connection to the probe interface circuit 48, a conductive outer sleeve 52 secured at a connector end 54 to the electrical connector 50 and having a distal end 56 and a center conductor 58 coaxial with the outer sleeve 52.

The electrical connector 50 includes an outer tube 60 housing a dielectric insert 62. A conductive rod 64 passes through the insert 62. An electrical terminal 66 is connected to a near end of the rod 64 and in turn to a 50 ohm coaxial cable 68 that connects to the probe interface circuit 48, see FIG. 2. A secondary seal 70 surrounds the terminal 66 and is secured in place using an adapter 72. The electrical terminal 66 is configured to produce a fiducial.

The outer sleeve connector end 54 is configured to threadably receive the electrical conductor 50, via the tube 60. An adapter body 74 surrounds the distal end of the dielectric insert 62 and receives a primary process seal 76. A pin 78 passes through the primary process seal 76 and connects the rod 64 to the center conductor 58.

The outer sleeve 52 proximate the connector end 54 is threadably received in an adapter in the form of the flange 28. Other types of adapters could be used in place of the flange 28. The flange 28 is secured to a process vessel (not shown) so that the probe 24 extends into the process vessel for sensing location of a liquid level interface L, as shown.

In accordance with the invention, the outer sleeve 52 has a first uniform inner diameter at 80 between the electrical connector 50 and a reference target 82. The inner diameter is stepped up at the reference target 82. The outer sleeve 52 has a second uniform inner diameter at 84 between the reference target 82 and the distal end 56. As such, the inner diameter increases at the reference target 82. In the illustrated embodiment, the probe has a characteristic impedance of 65 ohms corresponding to the first uniform inner diameter at 80 and a characteristic impedance of 75 ohms at the second uniform inner diameter at 84. Thus, the reference target 82 causes an increase in impedance which creates a positive reflected signal.

Figure 7:
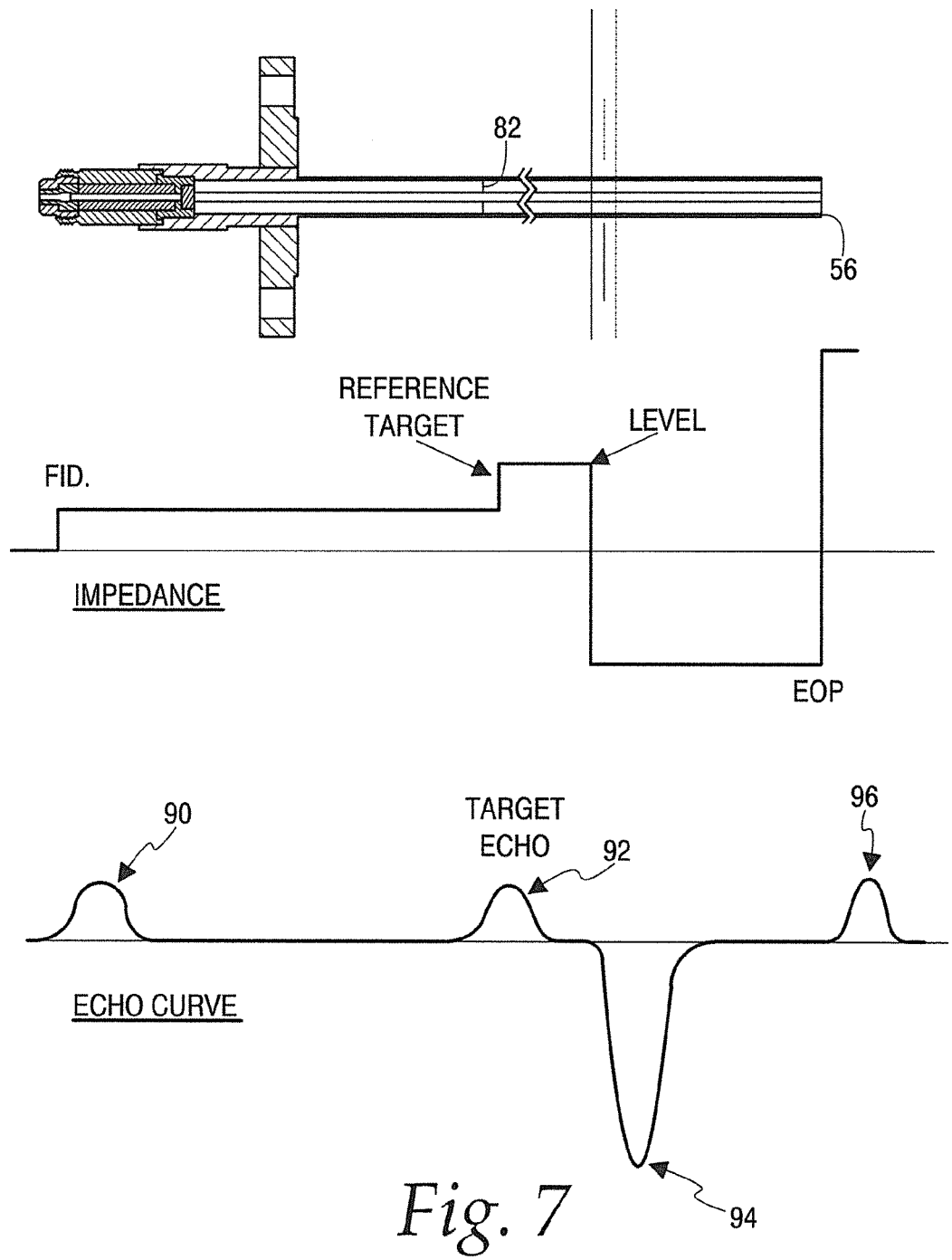
FIG. 7 is a schematic representation of the operation of the probe of FIG. 5

With the reference target 82 being on the conductive outer sleeve 52, as described, there is only one target reflection, which reduces transmission losses. Also, the reflection is only positive and cannot be confused as level. This is illustrated in FIG. 7 with the impedance curve showing an increase in impedance at the fiducial, a further increase in impedance at the reference target 82, a decrease in impedance at the liquid level and an increase impedance at the end of probe (EOP) corresponding to the outer sleeve distal end 56. This produces an echo curve showing a positive polarity pulse 90 at the fiducial, a positive polarity target echo 92 at the reference target, a negative polarity pulse 94 at the liquid level and a positive polarity pulse 96 at the EOP.

Thus, as described, an improved guided wave radar probe, which is used for industrial process level measurement, employs an outer reference target to compensate for changes in signal transmission propagation speed due to varying media dielectric.

It will be appreciated by those skilled in the art that there are many possible modifications to be made to the specific forms of the features and components of the disclosed embodiments while keeping within the spirit of the concepts disclosed herein. Accordingly, no limitations to the specific forms of the embodiments disclosed herein should be read into the claims unless expressly recited in the claims. Although a few embodiments have been described in detail above, other modifications are possible. Other embodiments may be within the scope of the following claims.

The invention claimed is:

1. A probe defining a transmission line for use with a measurement instrument including a pulse circuit connected to the probe for generating pulses on the transmission line and receiving reflected pulses on the transmission line, the probe comprising: an adapter for mounting to a process vessel; a conductive outer sleeve secured to the adapter; and a center conductor coaxial with the outer sleeve for conducting the pulses, the conductive outer sleeve having a connector end proximate the adapter and a distal end to extend into a process liquid, the outer sleeve having a geometric discontinuity defining a reference target producing an impedance change at a position between the adapter and the distal end at a location in a process vapor region above a process liquid.

2. The probe of claim 1 wherein the outer sleeve has a uniform inner diameter from the adapter to the reference target.

3. The probe of claim 2 wherein the outer sleeve inner diameter increases at the reference target.

4. The probe of claim 2 wherein the outer sleeve has a uniform inner diameter from the reference target to the distal end.

5. The probe of claim 1 wherein the outer sleeve has a stepped up inner diameter at the reference target.

6. The probe of claim 1 wherein the probe produces a single reflected pulse at the reference target location.

7. The probe of claim 1 wherein the probe produces a reference reflected pulse at the reference target location of an opposite polarity to a process liquid reflected pulse at the process liquid level.

8. A probe defining a transmission line for use with a measurement instrument including a pulse circuit connected to the probe for generating pulses on the transmission line and receiving reflected pulses on the transmission line, the probe comprising: a connector for electrical connection to the pulse circuit; a conductive outer sleeve secured at a connector end to the connector and having a distal end to extend into a process liquid; and a center conductor coaxial with the outer sleeve for conducting the pulses, the outer sleeve having a geometric discontinuity defining a reference target producing an impedance change at a position between the connector end and the distal end at a location in a process vapor region above a process liquid.

9. The probe of claim 8 wherein the outer sleeve has a uniform inner diameter from the adapter to the reference target.

10. The probe of claim 9 wherein the outer sleeve inner diameter increases at the reference target.

11. The probe of claim 9 wherein the outer sleeve has a uniform inner diameter from the reference target to the distal end.

12. The probe of claim 8 wherein the outer sleeve has a stepped up inner diameter at the reference target.

13. The probe of claim 8 wherein the probe produces a single reflected pulse at the reference target location.

14. The probe of claim 8 wherein the probe produces a reference reflected pulse at the reference target location of an opposite polarity to a process liquid reflected pulse at the process liquid level.

15. A probe defining a transmission line for use with a measurement instrument including a pulse circuit connected to the probe for generating pulses on the transmission line and receiving reflected pulses on the transmission line, the probe comprising: a connector for electrical connection to the pulse circuit; a conductive outer sleeve secured at a connector end to the connector and having a distal end to extend into a process liquid; and a center conductor coaxial with the outer sleeve for conducting the pulses, the probe having a reference target producing an impedance change at a position between the connector end and the distal end at a location in a process vapor region above a process liquid, wherein any reflected pulse at the reference target location has an opposite polarity to a process liquid reflected pulse at the process liquid level.

16. The probe of claim 15 wherein the outer sleeve has a uniform inner diameter from the connector to the reference target.

17. The probe of claim 16 wherein the outer sleeve inner diameter increases at the reference target.

18. The probe of claim 16 wherein the outer sleeve has a uniform inner diameter from the reference target to the distal end.

19. The probe of claim 15 wherein the outer sleeve has a stepped up inner diameter at the reference target.

20. The probe of claim 15 wherein any reflected pulse at the reference target location has a like polarity to an end of probe reflected pulse produced at a distal end of the center conductor.

* * * * *